United States Patent [19]

Heimeier et al.

[11] 4,313,179

[45] Jan. 26, 1982

[54] INTEGRATED SEMICONDUCTOR MEMORY AND METHOD OF OPERATING SAME

[75] Inventors: Helmut H. Heimeier, Herrenberg; Wilfried Klein, Holzgerlingen; Knut Najmann, Gaertringen; Friedrich C. Wernicke, Schoenaich, all of Fed. Rep. of Germany

[73] Assignee: International Business Machines Corporation, Armonk, N.Y.

[21] Appl. No.: 133,383

[22] Filed: Mar. 24, 1980

[30] Foreign Application Priority Data

Jun. 30, 1979 [DE] Fed. Rep. of Germany ....... 2926514

[51] Int. Cl.$^3$ .................... G11C 7/06; G11C 7/00
[52] U.S. Cl. .................... 365/189; 365/205; 365/190
[58] Field of Search ............. 365/154, 189, 190, 205, 365/207

[56] References Cited

U.S. PATENT DOCUMENTS

| | | | |
|---|---|---|---|
| 3,736,477 | 5/1973 | Berger et al. | 307/303 |
| 3,765,002 | 10/1973 | Basse | 340/173 |
| 3,801,965 | 4/1974 | Keller et al. | 365/189 |
| 3,815,106 | 6/1974 | Wiedmann | 365/154 |
| 3,983,412 | 9/1976 | Roberts et al. | 365/207 |
| 4,122,546 | 10/1978 | Basse et al. | 365/189 |
| 4,144,587 | 3/1979 | Miyakawa et al. | 365/189 |

FOREIGN PATENT DOCUMENTS 2612666 9/1977 Fed. Rep. of Germany .

OTHER PUBLICATIONS

Sonoda, "FET Stray and Coupling Capacitance Equalization Technique", *IBM Tech. Disc. Bul.*, vol. 17, No. 5, 10/74, p. 1355.
IBM TDB "Circuit Useable As Storage Cell, or Detector-Amplifier Cell" by H. Klepp, vol. 15, No. 5, Oct. 1972, pp. 1720–1721.

*Primary Examiner*—Stuart N. Hecker
*Attorney, Agent, or Firm*—Wesley DeBruin

[57] ABSTRACT

An integrated semiconductor memory having memory cells which have (or are designed to have) inherent asymmetrical access times for the distinguishable memory states thereof. The memory is operated on the basis of the shorter access time. This is accomplished by utilizing an oppositely asymmetrical sense system, preferably in the form of a pre-set sense latch.

For example, in the case of a digital memory with the reading of a "0" state having a shorter access time than the reading of a "1" state, at the beginning of a read operation a sense latch is set to the (slower) "1" state. Thus, only in the case of reading a "0" is the state of the latch changed to the "0" state. Thus, the actual access time is no longer determined by the longer access time, namely, the reading of a "1". The access time is determined by the shorter access time, namely, the reading of a "0".

The concept may also be used if the sense latch has an asymmetric access time. Then it is advantageous to intentionally choose a corresponding asymetrical memory cell design.

1 Claim, 4 Drawing Figures

INTEGRATED SEMICONDUCTOR MEMORY AND METHOD OF OPERATING SAME

FIELD OF THE INVENTION

The invention relates to integrated semiconductor memories having memory cells which have (or are designed to have) inherent asymmetrical access times for distinguishable memory states thereof. Circuit means and mode of operation are such that the memory is operated on the basis of the shorter access time.

REFERENCE TO RELATED PATENTS

U.S. Pat. No. 3,736,447, entitled "Monolithic Semiconductor Circuit For A Logic Circuit Concept of High Packing Density" granted May 29, 1973 to Horst H. Berger et al.

U.S. Pat. No. 3,815,106 entitled "Flip-Flop Memory Cell Arrangement" granted June 4, 1974 to Siegfried K. Wiedmann.

BACKGROUND OF THE INVENTION AND PRIOR ART

The invention relates to electric storage arrangements containing memory cells and associated read circuits for the output of the memory information. The invention is mainly applicable to integrated semiconductor memories for data processing systems, where inter alia a minimum effective access time to the stored data is of a particularly high importance.

Formerly, one of the important points in the development of new, or the selection of available memory arrangements had always been to ensure, with respect to the memory cells and read circuits, an optimum symmetry and consequently the same access times for the distinguishable memory states "0" and "1". As some examples of the continuous efforts, clearly evident in the prior art, to exclude or compensate for systematic asymmetries originating from the memory layout are U.S. Pat. No. 4,122,546 entitled "MOS Semiconductor Storage Module" granted Oct. 24, 1978 to P. W. von Basse et al. and the IBM Technical Disclosure Bulletin publication entitled "FET Stray and Coupling Capacitance Equalization Technique" by G. Sonoda, Vol. 17, No. 5, October 1974, page 1355.

Where such systematic asymmetries resulting in differing reading speeds, or access times, could not be excluded in the memory cell area, complex compensating measures were generally necessary to ensure the symmetrical operating conditions considered necessary. However, as a direct consequence of differing access times depending on the respective logic state stored, it had always to be tolerated that further processing of the read-out memory data could only take place on the basis of the longer access time.

SUMMARY OF THE INVENTION

It is the object of the invention to provide measures for the composition of memory cells and associated read circuits in a memory arrangement by means of which the resulting characteristics in read operations can be improved in such a manner that the effective access time is as short as possible. According to a summary thereof memory cells can be accepted or systematically designed in such a manner that with respect to the distinguishable memory states, e.g., in case of a digital memory for the logic "0" and "1", they show systematically different access times. Nevertheless, the read-out memory information can be processed on the basis of the shorter internal access time if in connection with such memory cells a correspondingly oppositely pre-set read amplifier is provided. In memory cells where e.g., the memory state "0" appears more quickly than the memory state "1" this means for example that at the beginning of a read operation the read amplifier is pre-set to the slower output state "1". If the read-out memory state is a (slow) "1" this output state exists already and does not require any further setting period of the output circuit. A switching of the output state is required only for a (quick) "0" to be read out which, however, is said to be available sooner at the output of the memory cell. The effective access time is thus no longer determined by the longer internal access time. This would normally be unavoidable.

A method of operating an integrated semiconductor store, characterized in that for reading out the stored data from memory cells that are systematically asymmetric with respect to the access times for the distinguishable memory states, at the beginning of a read operation, independently of the preceding output state, the output state of an associated read circuit is pre-set to the memory state having the longer access time, and that the output state of the read circuit is switched only upon the access to a memory state having the shorter access time.

The foregoing and other objects, features and advantages of the invention will be further apparent from the following more particular description and preferred embodiment of the invention as illustrated in the accompanying drawings.

DESCRIPTION OF THE PREFERRED EMBODIMENT

Figure 1:
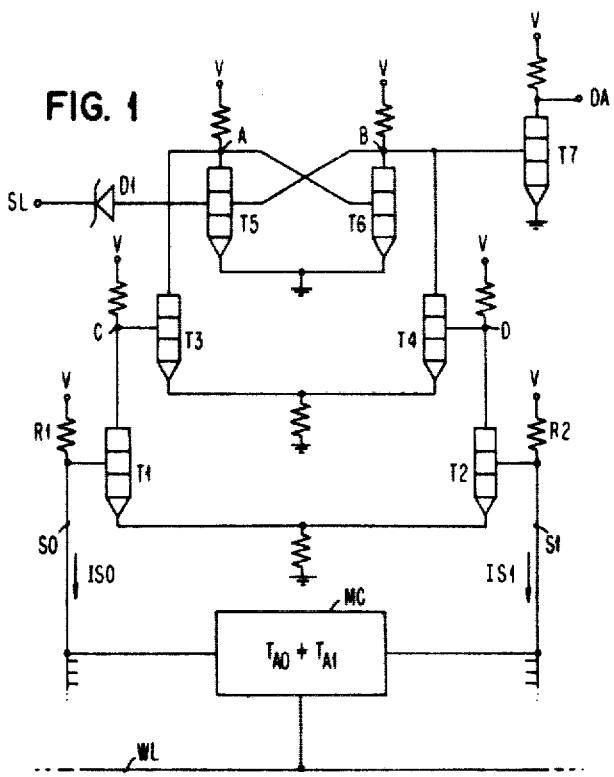
FIG. 1 is a partly schematic circuit diagram, in accordance with the invention, of a portion of an integrated store having a memory cell and an associated read circuit.

As an embodiment of the invention FIG. 1 shows schematically a memory cell MC together with a possible design of an associated read circuit. Since as pointed out above, the invention relates to the connection memory cell/read circuit further circuits for selection, writing systems etc., required for a complete memory arrangement are not represented in FIG. 1. Conventional circuits can be used for that purpose for which no special description need be given in connection with the present invention. With respect to the memory cell marked MC in FIG. 1, it is assumed that it shows different access times with respect to the distinguishable memory states. For the most frequently appearing case i.e., that a read process at the output of a selected memory cell is asymmetrical in such a manner that the logic "0" state appears earlier than the logic "1" state.

Figure 2:
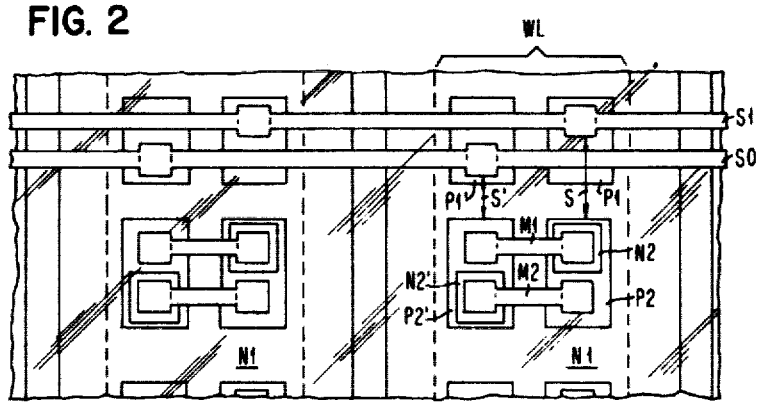
FIG. 2 is a plan view of a known integrated semiconductor memory cell with systematic asymmetry with respect to the access times.

As an example of such an asymmetrical memory cell FIG. 2 shows a section of a layout for an MTL- or I²L-semiconductor memory illustrating the layout of two such memory cells. The drawing shows a known memory cell. (Reference is made to; the IBM Technical Disclosure Bulletin publication entitled "MTL Storage Cell" by S. K. Wiedmann, Vol. 21, No. 1 June 1978 pages 231-2; U.S. Pat. No. 3,801,967 entitled "Monolithic Bipolar Transistor Storage Arrangement with Latent Bit Pattern" granted Apr. 2, 1974 to H. H. Berger et al., of common assignee herewith, and German Offenlegungsschrift No. 2612666 of common assignee. [U.S. patent application Ser. No. 763,138 now abandoned (GE 9-76-005) entitled "Highly Integrated Inverting Circuit" filed Jan. 27, 1977 by S. K. Wiedmann and of common assignee corresponds to German Offenlegungsshrift No. 2 612 666]. To give a brief summary: each memory cell contains two vertically designed transistors N1/P2/N2 and N1/P1'/N2' cross-coupled via conductive lines M1 and M2. Before each of these transistors an injection zone P1 or P1' is arranged on the left side for forming a lateral transistor structure P1/N1/P2 and P1'/N1/P2'. Over these injection zones, P1 and P1', arranged on the same side of the memory cell, are sense lines S1 and SO. Sense line S1 contacts injection zone P1, and accordingly sense line SO contacts injection zone P1'. Owing to the asymmetrical arrangement of these contacts in this layout, different spacings are obtained. In FIG. 2, these spacings are marked S and S'. Owing to the thus resulting asymmetrical lateral resistors, the sense signal for the one logic state appears systematically later than for the other one. It is, of course, also possible to design other layouts with systematically different internal access times.

The following specification will furthermore demonstrate that, in accordance with the invention, such asymmetrical cells cannot only be tolerated but that in some cases it may actually be of advantage to intentionally design such asymmetrical memory cells and yet be able to process the read-out memory data on the basis of the shorter internal access time. This is of interest particularly in those memories where (as in the above mentioned MTL memories) the sum of the internal access times for "0" and "1" is a constant within a specific range for a given manufacturing process and given minimum spacings, etc. Instead of emphasizing access times of maximum uniformity it will be shown that together with the steps specified below it can be highly advantageous to reduce the internal access time to a memory information of the one logical state, e.g., "0" state, at the expense of the access time to the "1" state.

Returning to FIG. 1, a read circuit is provided coupled to memory cell MC via the two sense lines SO and S1. The read circuit includes a two-stage differential amplifier (T1 to T4), a sense latch in the form of the flipflop (T5 and T6) and an output driver stage (T7). The letters A, B, C and D denote certain circuit nodes whose potential with respect to time will be referred to hereinafter to explain the operation of the circuitry in accordance with the invention. The sense latch shows a control input SL connected via a Schottky diode D1, so that the flipflop can be set to a predetermined state at the beginning of a read operation. The signal read out from the memory cell is available in amplified form at the data output DA for further processing.

Figure 3:
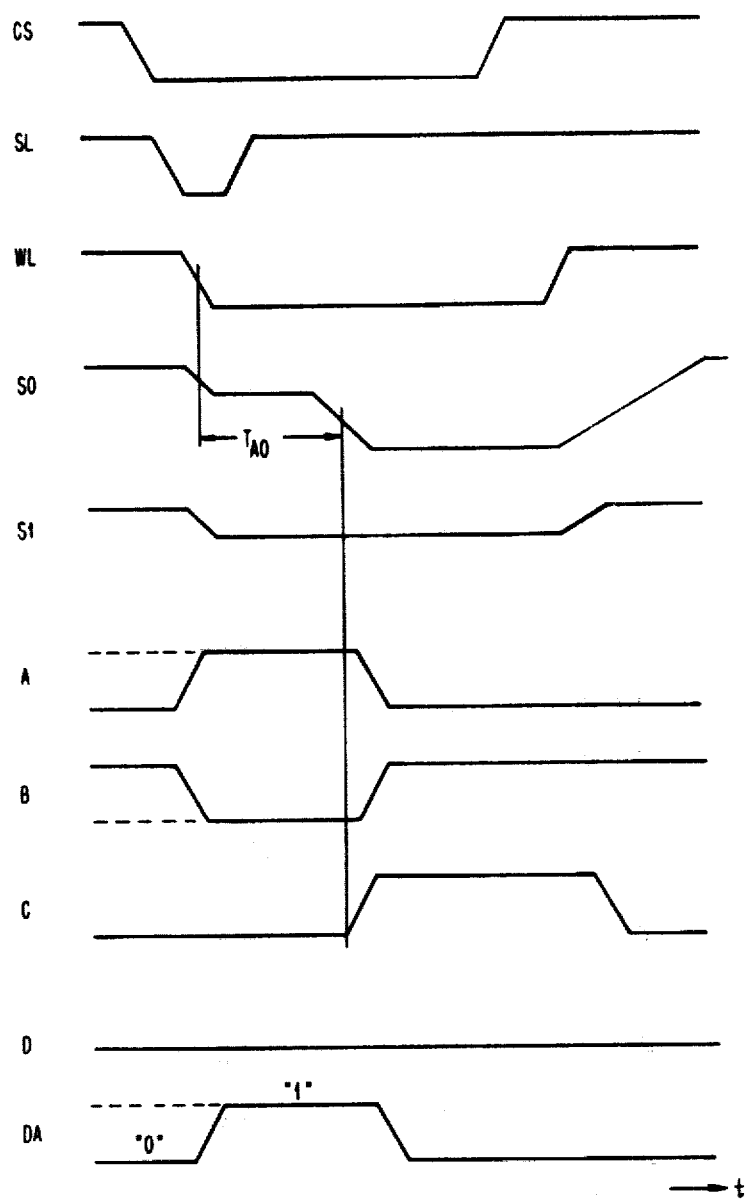
FIGS. 3 and 4 are timing diagrams explaining the operation of FIG. 1 in a read process for a (quick) "0" (FIG. 3), and for a (slow) "1" (FIG. 4).

Together with the timing diagrams, FIGS. 3 and 4, detailed reference will be made to the operation of the circuitry (FIG. 1), in accordance with the invention, in explaining the reading processes for the two distinguishable memory states i.e., a quick "0" and a slow "1".

In the standby state, wordline WL is not selected. The standby state corresponds to an upper voltage level on the wordline. No currents ISO and IS1 flow in sense lines SO and S1. Thus, the control inputs of transistors T1 and T2 of the first differential amplifier stage are biased in the conductive state, via resistors R1 and R2, by the positive supply voltage source V. Owing to the current flow through transistors T1 and T2, the potentials of nodes C and D at the input of the second differential amplifier stage are reduced to such an extent that transistors T3 and T4 are nonconductive. With nonconductive transistors T3 and T4, the sense latch is not influenced and can thus store, in accordance with its function, the memory information sensed in the preceding read cycle.

For the description of the operation in the selected state it is assumed that a "0" available with a relatively short internal access time is to be read out. The associated potential conditions are shown in FIG. 3. Via a usually available chip selection signal CS (not shown in the drawing), the chip is selected. Also the switching-on of the wordline WL (lowering of WL potential) is initiated. Further, a short setting signal SL for the sense latch is generated in the read process. This signal SL reduces, via a Schottky diode D1, the potential at circuit node B of the flipflop. If the flipflop had not previously been in its "1" stage (node B discharged) it flips into this state after the setting pulse, and at output DA there appears the upper voltage level in accordance with the "1" state. Via wordline WL, the memory cell to be read is selected and supplies, after an internal access time TAO, a corresponding read signal on the SO line. This internal access time TAO covers the period from the lowering of the WL potential followed at first by the SO potential to the further potential decrease on the SO (or S1) line depending on the respective memory state. For demonstrating these processes in the drawing, the 50% values of the pulse transitions have been used. When a (high speed) "0" state is read, there consequently appears on the SO line a potential decrease which is deeper relative to the S1 line. This signal is amplified via the two differential amplifiers with transistors T1 to T4, transistor T1 of the two previously conductive transistors T1 and T2 being switched off, and T3 of the two previously nonconductive transistors T3 and T4 in the next differential amplifier stage being switched on. Owing to the now conductive transistor T3, the potential of circuit node A is decreased so that the flipflop switches into the state that is opposite to the standby state, and the lower voltage level corresponding to a "0" appears at the output DA.

In order to prevent that during the selection of the wordline any small asymmetries could switch the sense latch into the "0" state by mistake it can be advantageous to render the first differential amplifier stage with transistors T1 and T2 slightly less sensitive, e.g., in that the emitter surface of transistor T1 is slightly larger than that of transistor T2.

Figure 4:
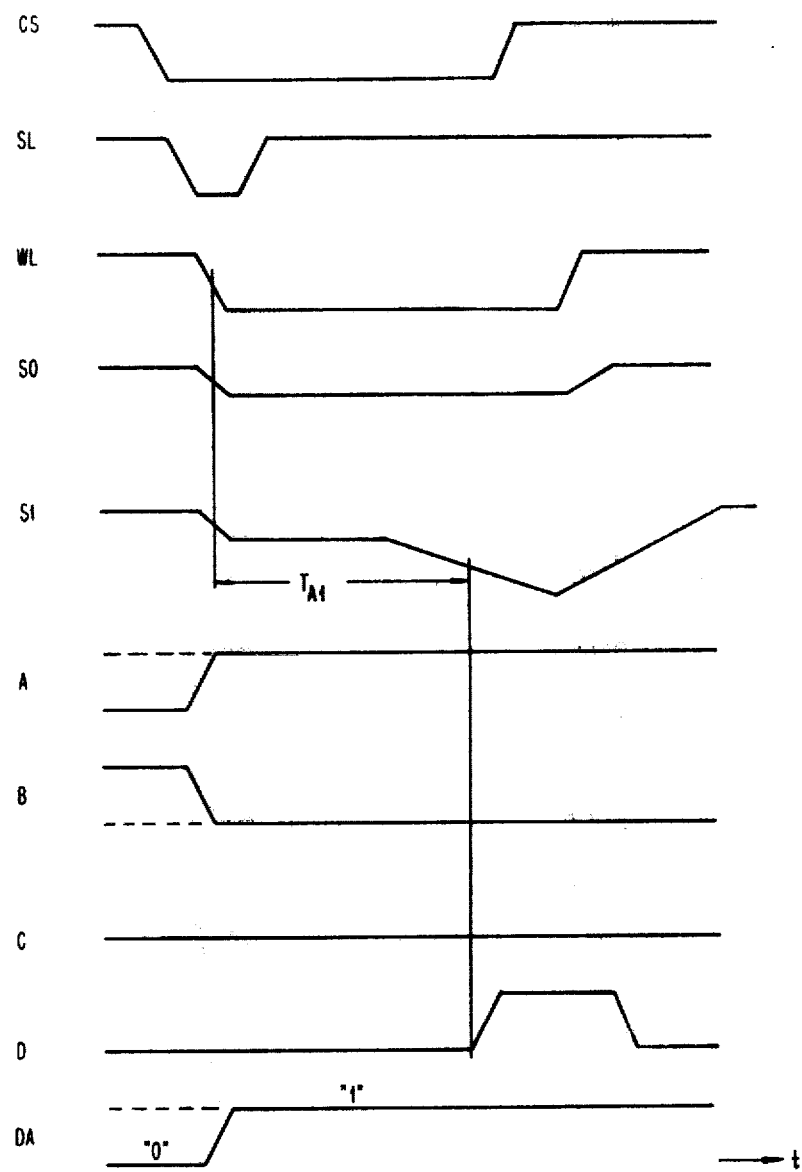

FIG. 4 shows the read process for a (slow) "1". With respect to the conditions at the beginning of the read process there is no difference as compared with FIG. 3. As described above, the sense latch has been pre-set shortly after the beginning of the read cycle to the "1" stage associated with the longer internal access time. So there is already a "1" at output DA independently of the previously read memory state. The potential of the S1 line is finally lowered, in this case only after a relatively long internal access time TA1, and switches off transistor T2. Thus, the potential at node D can rise and transistor T4 can be conductive. Circuit node B of the sense latch, however, has been discharged already at the beginning of the read process. So the time when transistor T4 is switched on by the slow read signal is no longer of any importance for the effective access time with respect to data output DA. In other words, if a "1" state is to be read out its relatively long internal access time is not included in the external access times because in that case only circuit node B has to be recharged which, however, does not influence the output. The recharging of this node has merely to be executed before the full termination of the read cycle.

As far as the above described embodiment has been referred to for demonstrating the invention, it should be pointed out once more that within the scope of the invention there exists a great variety of embodiments with regard to the respective memory cells as well as read circuits. The invention, to give an example, is in no instance restricted to memory cells with only two distinguishable states. A gain of effective access time can equally be reached with more than two distinguishable memory states of which at least one shows a relatively longer internal access time. For the design of the associated read circuit it would also in this case merely be necessary to preset at the beginning of the read process the output state being associated with the longer internal access time. Furthermore, the invention is not restricted to memory cells of a specific technology type, e.g., with bipolar or field effect transistors; it is equally possible to assemble other than semiconductor memory arrangements in the manner described. It will be of no importance whether read/write memories, read-only memories or the like are used, because the invention relates to the improvement of the read operation characteristics in the manner described above.

Similarly, with respect to the possible read circuits the invention is not restricted to the assumptions made in the above embodiment. A read circuit does not have to comprise in any case a latch and/or a (even two-stage) differential amplifier. In memory cells with a comparatively high read signal an output stage could also be addressed directly. In that case the steps for pre-setting a specific output stage would have to be provided within the output stage. Furthermore, such an output driver, if at all required beside a differential amplifier and/or latch, would not have to be designed as an inverter in any case, as in the embodiment.

Finally, using the method in accordance with the invention, can also be indicated in that for specific reasons a read circuit would have to be assumed that is asymmetrical regarding the reading speed for the distinguishable memory states. In this case, too, on the basis of the read signal with the higher reading speed the externally available access time to the data could be improved by an intentionally oppositely directed asymmetrical layout of the memory cells to be used.

It is thus evident that what has formerly been considered disadvantageous as a rule, i.e., an asymmetry of the internal access times or reading speeds for the various memory states, can be made into an advantage regarding the externally decisive operating properties, with the read circuits and memory cells being composed accordingly.

While the invention has been particularly shown and described with reference to the preferred embodiment thereof, it will be understood by those skilled in the art that various changes in form and detail may be made therein without departing from the spirit and scope of the invention.

We claim:

1. In a monolithic memory having at least one asymmetric memory cell, said memory cell having a first stable state and a second stable state, said memory cell requiring a greater read time when said cell is in said second state than when said cell is in said first state, reading means for reading said memory cell, said reading means having first and second stable states corresponding respectively to said first and second stable states of said memory cell, said reading means including:

first, second, third, fourth, fifth, sixth and seventh transistors, each said transistor having an emitter, base and collector; a word line coupled to said memory cell; a first bit line coupling said memory cell to said base of said first transistor; a second bit line coupling said memory cell to said base of said second transistor; a first resistor connecting said base of said first transistor to a first potential; a second resistor connecting said base of said second transistor to said first potential;

said emitter of said first transistor and said emitter of said second transistor connected in common via an eighth resistor to a second potential; said collector of said first transistor and said base of said third transistor connected in common via a third resistor to said first potential; said collector of said second transistor and said base of said four transistor connected in common via a fourth resistor to said first potential;

said emitter of said third transistor and said emitter of said fourth transistor connected in common via a ninth resistor to said second potential; said collector of said third transistor, said collector of said fifth transistor and said base of said sixth transistor connected in common via a fifth resistor to said first potential;

said collector of fourth transistor, said collector of said sixth transistor, said base of said fifth transistor, and said base of said seventh transistor connected in common via a sixth resistor to said first potential;

said emitter of said fifth transistor and said emitter of said sixth transistor connected in common to said second potential;

said emitter of said seventh transistor connected to said second potential;

said collector of said seventh transistor connected via a seventh resistor to said first potential;

set means for setting said reading means in said second state, said set means including a diode connected to said base of said fifth transistor; and output means for manifesting the stable state of said reading means, said output means including a terminal connected to said collector of said seventh transistor.

* * * * *